(12) United States Patent
Parriaux et al.

(10) Patent No.: US 6,219,478 B1
(45) Date of Patent: Apr. 17, 2001

(54) LIGHT WAVE DIFFRACTION DEVICE

(75) Inventors: Olivier M. Parriaux, 6, Place Saint-Roch, F-42100 Saint-Etienne (FR); Alexandre V. Tishchenko; Vladimir A. Sychugov, both of Moscow (RU)

(73) Assignee: Olivier M. Parriaux, Saint-Etienne (FR)

( * ) Notice: Subject to any disclaimer, the term of this patent is extended or adjusted under 35 U.S.C. 154(b) by 0 days.

(21) Appl. No.: 09/236,233

(22) Filed: Jan. 22, 1999

(30) Foreign Application Priority Data

Jan. 23, 1998 (EP) .................................................. 98101221

(51) Int. Cl.⁷ ................................. G02B 6/34; G02B 6/10
(52) U.S. Cl. .............................. 385/37; 385/130; 385/131
(58) Field of Search ................................. 385/10, 15, 27, 385/31, 37, 129–132

(56) References Cited

U.S. PATENT DOCUMENTS

| | | | |
|---|---|---|---|
| 4,828,356 | * 5/1989 | Hobrock et al. | 359/572 |
| 5,216,680 | * 6/1993 | Magnusson et al. | 385/37 |
| 5,598,300 | * 1/1997 | Magnusson et al. | 385/37 |
| 5,852,702 | * 12/1998 | Nishida et al. | 385/130 |

OTHER PUBLICATIONS

Svakhin.A.S. et al., "Diffraction Grating with High Optical Strength for Laser Resonators", Quantum Electronics, vol. 24 No. 3, Mar. 1, 1994, pp. 233–235.

Loktev, S.M. et al., "Reflective of a Finite Light Beam from a Finite Waveguide Grating" Quantum Electronics, vol. 27 No. 5, May 1997, pp. 445–449.

Sychugov, V.A. et al., "Optimazation and Control of Grating Coupling to or from a Silicon–Based Optical Engineering", vol. 35 No. 11, Nov. 1966, pp. 3092–3099.

Sov. Phys. Tech. Phys. 36(9), Sep. 1991, pp. 1038–1040, "Efficient diffraction elements for TE–polarized waves", A. S. Svakhin et al.

* cited by examiner

Primary Examiner—John D. Lee
Assistant Examiner—Juliana K. Kang
(74) Attorney, Agent, or Firm—Griffin & Szipl, P.C.

(57) ABSTRACT

Light wave diffraction device formed of a dielectric layer (4), a reflecting structure (12) arranged on one lower face (10) of said layer, and a diffraction grating (8) arranged on one face (6) of said layer. The height (H) of the layer is selected so as to substantially satisfy the resonance condition for a leaky mode in said layer for at least one given incident wave having a wavelength $\lambda$ and a determined angle of incidence. Next, the diffraction grating has a spatial period selected so that the incident wave is diffracted essentially along the first negative diffraction order and at an angle of diffraction different to the angle of incidence (outside the Littrow condition). In particular, the invention provides that either the angle of incidence, or the angle of diffraction is high, i.e. relatively close to 90° from the direction perpendicular to the diffraction grating. This diffraction device allows a very high diffraction efficiency, of up to 100%, to be obtained, even when the incident wave is grazing.

23 Claims, 2 Drawing Sheets

LIGHT WAVE DIFFRACTION DEVICE

The present invention concerns a light wave diffraction device. In particular, the invention concerns a device of this type formed by a layer, in particular a dielectric layer, in which light waves can propagate, and which has a diffraction grating arranged on one face thereof.

Devices of this type have been described recently in scientific publications, in particular in the article "Diffraction gratings with high optical strength for laser resonant cavities", Quantum Electronics, 24 (3), pages 233 to 235, 1994. This document describes only one use for a device of the aforementioned type under the particular Littrow condition, i.e. with a "−1" order diffracted wave propagating along the line of the incident wave but in the opposite direction. In these conditions, an approximate analytical formulation was established for the diffraction efficiency (about 85%) according to the "−1" order. Within the scope of this research, it was shown that in these particular conditions, high levels of efficiency could be obtained for angles of incidence of around 45°. According to this document, when the angle of incidence θ (defined from the direction normal to the diffraction grating) increases, there is efficiency of approximately 60% (θ=68°). For still larger angles of incidence, for example for θ=85°, it is mentioned that calculations have shown that it is possible to expect levels of efficiency of up to 50%.

First, it will be noted that the aforementioned document only provides teaching for a use of the aforementioned type of diffraction device under the particular Littrow condition. Those skilled in the art are thus not provided with any teaching concerning the situation in which the "−1" order diffracted light propagates along a different direction to the direction of incidence.

Secondly, on the basis of the aforementioned document, those skilled in the art cannot expect very high diffraction efficiency values, when the angle of incidence is large, for example greater than 70°. For angles of incidence of approximately 80°, one does not expect to obtain an efficiency greater than 50% with the teaching of the prior art. Thus, with a diffraction efficiency not exceeding 50%, numerous applications have no future with the proposed diffraction device.

A lack of teaching is thus noted for diffraction devices whose first order diffracted wave direction is different to the direction of incidence although this situation is favourable to numerous applications. Next, those skilled in the art who would modify the spatial period of the diffraction grating so as to obtain such a situation for the incident wave diffraction can expect a relatively low diffraction efficiency, i.e. less than or equal to 50%, when the angle of incidence defines a relatively large angle, i.e. close to 90° with respect to the direction perpendicular to the diffraction grating plane.

Thirdly, the preconceived ideas of those skilled in the art are confirmed hen a first conventional analysis is performed on the rays reflected, refracted or diffracted by a diffraction structure of the type currently under consideration. Indeed, during a conventional analysis of the different light rays present, those skilled in the art will note that with an angle of incidence of approximately 45°, the intensity of the reflected wave is initially of an order comparable with the intensity of the wave transmitted in the dielectric layer and with the intensity of the wave diffracted in said dielectric layer in accordance with the "−1" order diffraction order. Thus, for angles of incidence of approximately 45°, those skilled in the art expect to be able to compensate the wave reflected by destructive interference with the transmitted wave re-exiting the dielectric layer and also with the contribution of the "−1" order diffracted wave in the layer and re-exiting the latter also by diffraction in the direction of the reflected wave. Conversely, when the angle of incidence increases and becomes relatively large, i.e. it approaches 90° and in particular in the situation of a grazing incidence, the intensity of the reflected wave, relative to the intensity of the incident wave, is very significant and close to 100%. Within the scope of such an analysis, which those skilled in the art generally perform in order to orient their research, a priori confirmation is received of the fact that the diffraction efficiency for a low incidence, in particular grazing incidence, is limited.

Despite the situation described hereinbefore, which prevails in the field of optical diffraction devices prior to the present invention, and the preconceived idea of those skilled in the art of designing such high efficiency arrangements for a grazing incident wave or a grazing "−1" order diffracted wave, inventors have directed their research in this direction by seeking to determine to what extent the dielectric layer, at a surface of which the diffraction grating is arranged or in which it is recorded, can be used to resolve or can contribute to resolving the problem of cancelling the high intensity of reflected light. Within the scope of such research, they have ended up using the dielectric layer as a leaky waveguide propagating a leaky mode. They have thus demonstrated that by correctly determining the characteristic parameters of the diffraction device which forms the subject of the present invention, resonance can be generated in the dielectric layer and a high energy wave can thus be propagated in this layer in accordance with a corresponding leaky mode. As a result of the excitation of resonance in the dielectric layer by an incident wave of a given wavelength and large angle of incidence, it is possible to accumulate sufficient energy in this layer for the amplitude of a wave exiting the layer in the direction of reflection to have an amplitude comparable to the amplitude of the initially reflected wave and a phase shift of substantially $\pi$ allowing destructive interference. This allows the intensity of the reflected light to be reduced. The adjustment of the two amplitudes to equality is performed by the diffraction grating which thus allows cancellation of the reflected wave. In order to do this, a specific depth of the diffraction grating is determined. Thus, the luminous intensity reflected by the diffraction device propagates essentially along the diffraction directions. By correctly selecting the spatial period of the diffraction grating, it is possible to limit diffraction to the "−1" order outside this diffraction device. Thus, a very high diffraction efficiency is obtained, which can theoretically be equal to 100%.

The invention concerns a light wave diffraction device formed of a layer in which light waves can propagate and a diffraction grating or equivalent diffraction means arranged on one face of or within said layer. This device is characterised in that the mean height of said layer substantially satisfies the resonance condition for a leaky mode in said layer for at least one incident wave having a wavelength λ and a given angle of incidence defined relative to the direction perpendicular to the grating or the equivalent diffraction means, and in that this grating or these equivalent diffraction means has or have a spatial period whose value is determined to diffract said incident wave essentially along the first negative order of diffraction and at an angle of diffraction $\epsilon_c$ having a different value to that of said angle of incidence.

As a result of the features of the device of the invention it is possible to obtain very high diffraction efficiency values outside the situation corresponding to the Littrow condition, in particular at a large angle of incidence. The solution of the present invention does not a priori allow a high diffraction efficiency to be obtained in the Littrow condition given that there is a symmetry in the dielectric layer between the refracted wave and the "−1" order diffracted wave. Thus, the conditions of the present invention assuring resonance in the layer on the basis of the refracted wave also generate resonance on the basis of the diffracted wave in this layer. In this particular situation, there are thus two leaky waves propagating in the layer in opposite directions. Consequently, in the conditions selected for the present invention, the particular situation substantially corresponding to the Littrow condition is removed. The present inventors have not currently conducted any particular research to determine the diffraction efficiency which can be envisaged with the Littrow condition.

The effect of the present invention is particularly surprising in a preferred embodiment wherein the angle of incidence is greater than 80° and the angle of diffraction is less than the angle of incidence. In a particularly advantageous case of this embodiment for various applications, the angle of diffraction is relatively small and considerably less than the angle of incidence. In order to avoid diffraction losses of the orders greater than 1, one will preferably select a diffraction grating defining a direction of diffraction for the "−1" order with an angle which is positive or substantially equal to zero it being understood that the angle of incidence has a positive value.

Given that it is possible to obtain very high diffraction efficiency values almost approaching 100%, it is possible to apply the reciprocity theorem and to use the diffraction device according to the invention with an incident wave having a relatively low angle of incidence and a direction of diffraction defining a large angle of diffraction, in particular greater than 80°. However, in this last case, the model is not reciprocal in the case of a normal incident wave. Thus, according to another preferred embodiment, the diffraction device is provided in a configuration with an angle of diffraction greater than 80° and with an angle of incidence lower than said angle of diffraction and greater than zero, it being understood that the angle of diffraction has a positive value.

The present invention and various uses or applications thereof will be described hereinafter with the aid of the following description, made with reference to the annexed drawings which are given by way of example, in which.

Figure 1:
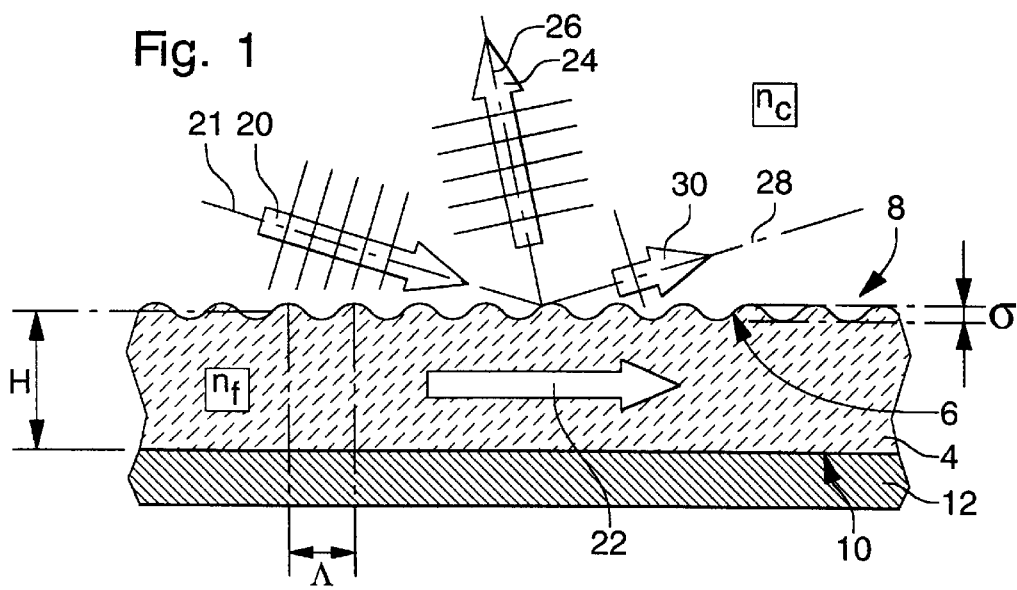
FIG. 1 shows schematically a diffraction device according to the invention with an incident wave and the waves generated by this device.
Figure 2:
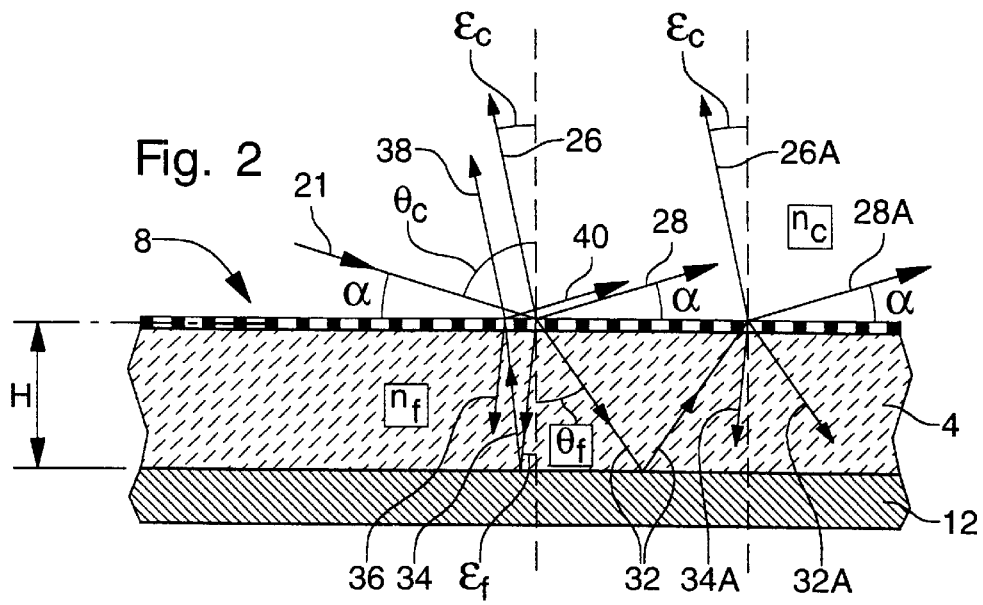
FIG. 2 shows schematically according to a conventional analysis various optical rays present and the directions thereof so as to visualise the waves involved in the analysis of the interaction between an incident wave and the device of the invention.
Figure 3:
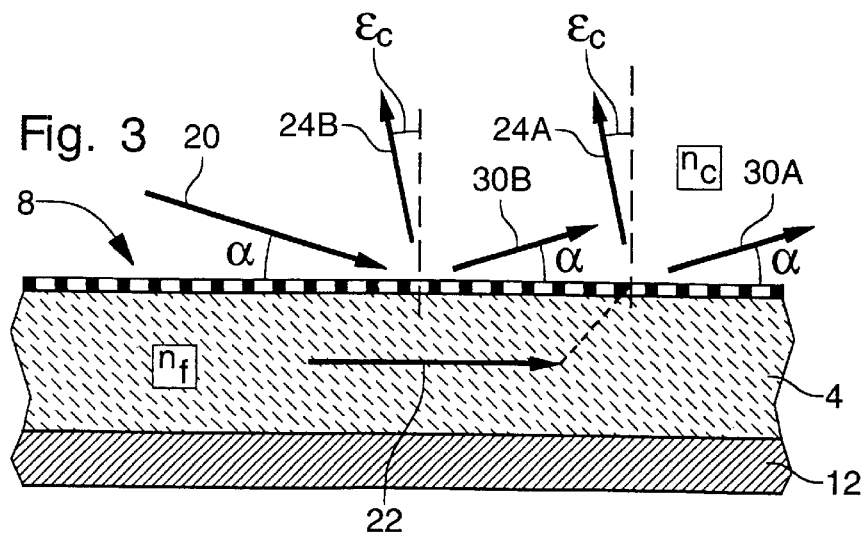
FIG. 3 is a simplified diagram of FIG. 2 showing the concept which is at the basis of the present invention.

With reference to FIGS. 1 to 3, the diffraction device according to the invention and the features thereof will be described hereinafter. This device is formed of a dielectric layer 4 in which light waves can propagate. A diffraction grating 8 is provided on an upper face 6 of layer 4. This grating 8 has a spatial period Λ. A reflective structure 12 is arranged against a lower face 10 of layer 4.

The incident wave 20 has a determined wavelength λ and has an angle of incidence $\theta_c$, this angle being defined relative to the direction perpendicular to diffraction grating 8. Thus, the angle a between the direction of incidence and the plane defined by the diffraction grating is equal to $\pi/2-\theta_c$. The characteristic parameters of the device, in particular the mean height H of layer 4 and the refractive index $n_f$ of this layer are selected so that layer 4 substantially satisfies the excitation condition of a leaky mode in this layer for the given incident wave 20. Thus, a wave 22 (hereinafter called the leaky wave) propagates in layer 4 in accordance with said leaky mode when incident wave 20, having a predefined angle of incidence and wavelength, arrives on diffraction grating 8.

Spatial period Λ of grating 8 is determined so that a "−1" order diffracted wave propagates along a direction of diffraction 26 defining an angle of diffraction $\epsilon_c$ defined relative to the direction perpendicular to grating 8. Along the direction of reflection 28, a reflected wave 30 of low intensity propagates when the diffraction efficiency is not maximum. One aim of the invention is to greatly reduce the intensity of reflected wave 30, or make it zero in order to obtain a very high diffraction efficiency in direction 26. Spatial period Λ of grating 8 is determined so that incident wave 20 is essentially diffracted along direction 26, i.e. along the "−1" diffraction order. As FIGS. 1 to 3 show, the field of the invention concerns situations in which diffraction direction 26 is different from direction of incidence 21.

Various geometrical rays are shown in FIG. 2 corresponding to various waves resulting from the presence of an incident wave along direction of incidence 21. The analysis using geometrical optics allows three determining events in the redistribution of the luminous energy in the incident wave medium to appear.

The first event occurs at the point of impact of incident ray 21 (assimilated to the direction of incidence). Incident ray 21 generates a reflected ray 28 (assimilated to the direction of reflection), a refracted ray 32 propagating in layer 4, a first "−1" order diffracted ray 34 also propagating in layer 4 and a diffracted ray 26 (assimilated to direction of diffraction 26) propagating in the medium of incident ray 21 (incidence medium).

The second event concerns the point of impact of ray 34 which is diffracted on grating 8 then reflected by the mirror 12. Three optical rays are generated during this second event. There is reflected ray 36, refracted ray 38 and "−1" order diffracted ray 40. In particular for shallow depths σ of grating 8, one expects refracted ray 38 to be predominant along direction of diffraction 26, the amplitude of reflected and diffracted rays 36 and 40 being then small. It will be noted that a grating 8 of shallow depth is particularly suited to a grazing incidence or more generally, to relatively large angles of incidence $\theta_c$, for example greater than 80°.

The third event is defined by the impact of refracted ray 32 on diffraction grating 8 after said refracted ray 32 has undergone reflection on mirror 12. Refracted ray 32 arriving on grating 8 is optically equivalent to incident ray 21. The optical rays generated are thus the same as those generated by incident ray 21. A refracted ray 28 a propagating along direction of reflection 28, a reflected ray 32a propagating in layer 4 and two "−1" order diffraction rays 26a and 34a are thus generated.

According to the invention, the characteristic parameters of the diffraction device are determined so that the various contributions along direction of reflection 28 are cancelled out by destructive interference. As was already mentioned, the amplitude of the wave corresponding to ray 40 is low. Conversely, the amplitude of the reflected wave corresponding to optical ray 28 has a high amplitude. When the leaky mode condition is fulfilled for layer 4, there is a constructive contribution of the refracted incident wave in layer 4 to leaky mode 22 propagating in said layer. Indeed, the resonance corresponds to a constructive interference between the refracted then reflected wave 32 propagating in layer 4 and the refracted wave at any point of impact on said layer. Thus, an accumulation of energy is obtained in layer 4 which originates from the resonance described here. This energy exits partially along direction of reflection 28 and partially along direction of diffraction 26. Given that leaky wave 22 has a high amplitude, the present inventors have demonstrated that it is possible, by correctly selecting the depth σ of diffraction grating 8, to compensate the high amplitude of the wave initially reflected by the wave exiting layer 4 along direction of reflection 28. It happens that the excitation condition of a leaky mode on the basis of refracted wave 32 generates a wave exiting layer 4 (corresponding to optical ray 28A) with a phase shift π in relation to the initially reflected wave (corresponding to optical ray 28).

In summary, one can see that the inventive concept consists of exciting in layer 4 a leaky mode (leaky wave 22) acting as energy accumulator and of determining the depth a of diffraction grating 8 so as to define the amplitude of the wave exiting layer 4 along direction of reflection 28 so that it is substantially equal to the amplitude of the reflected wave. Thus for a given incident wave 20, it is possible to select a height H of layer 4 and a depth σ of diffraction grating 8 to obtain a destructive interference along direction of reflection 28 and thus a very high diffraction efficiency along direction of diffraction 26. Theoretically, it is possible to obtain a diffraction efficiency of 100% as long as the diffraction device does not absorb or scatter luminous energy.

In order to schematise the inventive concept described hereinbefore as well as possible, the waves essential to the description of the physical phenomenon implemented within the scope of the present invention are represented in FIG. 3 by various vectors. Incident wave 20 arrives at a complementary angle of incidence α on diffraction grating 8. This initial event generates a diffracted wave 24B, a reflected wave 30B and a leaky wave 22 propagating in layer 4 in accordance with a leaky mode excited by the refracted wave in layer 4. Leaky wave 22 exits layer 4 into the incidence medium essentially along direction of reflection 28 and along direction of diffraction 26 defining angle of diffraction $\epsilon_c$. Thus, leaky wave 22 generates a wave 30A propagating parallel to wave 30B and a diffracted wave 24A propagating parallel to the direction of wave 24B.

The various characteristic parameters of the diffraction device according to the invention are determined so that the amplitude of wave 30B is close to the amplitude of wave 30A or equal thereto. Since the phase shift between waves 30A and 30B is substantially equal to π, there results a destructive interference which greatly reduces or cancels the luminous intensity propagating along the direction of reflection. Conversely, diffracted waves 24A and 24B interfere constructively and thus define a direction of propagation for the luminous energy reflected by the diffraction device. For the sake of precision, it will be noted that wave 24B corresponds to the joint contributions of optical rays 26 and 38 of FIG. 2 and wave 30B corresponds to the joint contributions of the waves corresponding to optical rays 28 and 40 of FIG. 2. For the reasons mentioned hereinbefore, α does not define the complementary angle of $\epsilon_c$ on π/2, the direction of diffraction being different from the direction of incidence.

The excitation condition of a leaky mode in dielectric layer 4 is given for a layer with the upper and lower faces thereof substantially plane by the characteristic equation:

$$KH(n_f^2 - n_c^2 \cos^2\alpha)^{1/2} = m\pi - \phi/2$$

where $K = 2\pi/\lambda$, λ being the wavelength of the incident wave, $n_c$ is the refractive index of the propagation medium of the incident wave;

$n_f$ is the refractive index of dielectric layer 4;

$\alpha = \pi/2 - \theta_c$, $\theta_c$ being said angle of incidence of the incident wave;

m is a natural integer number; and

φ is the phase shift generated by the reflection of the transmitted wave onto the reflective structure.

When the diffraction grating is of shallow depth, upper face 6 of layer 4 is relatively undisturbed and the aforementioned characteristic equation remains essentially valid. Conversely, when the diffraction grating has a relatively large depth, this equation gives only a first approximation and it is necessary to use then appropriate computer tools to determine accurately the height H of layer 4 corresponding exactly to the excitation of a leaky mode by using the calculation of the value given for the height by this equation, which those skilled in the art will know how to do. However, within the scope of a preferred embodiment where the incident wave has a relatively large angle of incidence $\theta_c$, more particularly substantially equal to 85° or greater than such value, the depth of the diffraction grating within the scope of the present invention is relatively shallow, and consequently the characteristic equation hereinbefore is substantially valid.

Figure 4:
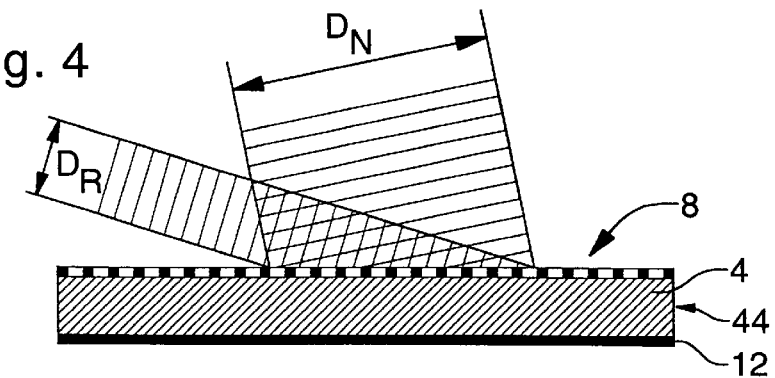
FIGS. 4 to 6 show respectively three applications of the device according to the invention.

For certain applications, it is particularly advantageous to be in grazing incidence, in particular with an angle of incidence $\theta_c$ greater than or equal to 88°. In particular, the diffraction device can be used as a beam expander as is shown in FIG. 4 in which the incident beam of diameter $D_R$ is reflected along a direction close to the direction perpendicular to diffraction grating 8 with a greatly enlarged diameter $D_N$. The more the incidence is grazing, the greater the expansion.

It will be noted that the incident wave can have a transverse electrical (TE) polarisation or a transverse magnetic (TM) polarisation relative to the direction defined by the lines of the diffraction grating. In the case of a TE polarisation (electric field parallel to the lines of the grating) and with a grazing incidence, the inventors have determined an analytical expression allowing the depth o of diffraction grating 8 to be selected analytically for a very high diffraction efficiency theoretically close to 100% (case in which reflecting structure 12 reflects almost the entirety of the luminous energy). The analytical expression for depth σ is as follows:

$$\sigma = \frac{4}{K} \cdot \frac{(\sin\alpha \cdot n_c)^{1/2}}{(n_f^2 - n_c^2\cos^2\alpha)^{1/2} \cdot (n_f^2 - n_c^2)^{1/2}} \cdot \left[1 + \left(\frac{n_f \cos\varepsilon_f}{n_c \cos\varepsilon_c} tg(KHn_f \cos\varepsilon_f + \psi/2)\right)^2\right]^{1/2}$$

The characteristic parameters involved in the above analytical expression which have already been described will not be described again. All the other parameters are given in FIG. 2. $\theta_f$ is the angle of refraction of the incident wave 21 defined relative to the direction perpendicular to grating 8.

$\epsilon_f$ is the angle of diffraction relative to said normal direction for the "−1" order diffracted wave propagating in dielectric layer 4 and $n_c$ is the refractive index of the incident medium. $\Psi$ is the phase shift at the reflection on said reflective structure for the "−1" order diffracted wave in said layer.

The condition for the leaky mode requires that $KHn_f = (m\pi - \phi/2)/\cos\theta_f$.

It will be noted that $\epsilon_f$ and $\epsilon_c$ are connected by the law of refraction. The same is true for $\theta_c$ and $\theta_f$. It is thus possible to formulate the above analytical expression using $\epsilon_c$ and $\theta_c$, to the exclusion of $\epsilon_f$ and $\theta_f$. Those skilled in the art also know how to put $\theta_c$ in such a formula instead of complementary angle $\alpha$.

For mean height H of layer 4, one starts from the middle of the fundamental harmonic of the development in Fourrier series of the profile of diffraction grating 8. Depth $\sigma$ is the total peak to peak amplitude of this fundamental harmonic. Starting from the analytical result, those skilled in the art can use computer tools to determine $\sigma$ even more precisely in order to actually obtain a very high efficiency close to 100%.

In order to take full advantage of the possibilities of the diffraction device according to the invention, the different characteristic parameters are preferably determined to assure a very high diffraction efficiency. In particular, according to a preferred embodiment, the depth of the diffraction grating is determined so that the diffraction efficiency of said incident wave in the "−1" order diffraction direction is substantially equal to or greater than 95%.

By applying the reciprocity theorem in the case of a high "−1" order diffraction efficiency, one concludes that it is possible to have an incident wave having a "−1" order diffraction direction with a relatively large angle of diffraction $\epsilon_c$ and in particular substantially equal to or greater than 85°. This surprising result is due in particular to the excitation of a leaky mode in dielectric layer 4 on the basis of the "−1" order diffracted wave in this layer 4. This particular configuration is advantageous for various applications. The angle of incidence is selected to be greater than zero, it being understood that the angle of diffraction is positive. According to an advantageous alternative, the polarisation of the incident wave is TE. Preferably, the characteristic parameters and in particular the depth of the diffraction grating are determined so that the diffraction efficiency is substantially equal to or greater than 95%.

It will be noted that the excitation of a leaky mode in the dielectric layer of the diffraction device according to the invention is determining for the two aforementioned preferred embodiments where either the incident wave has an angle of incidence $\theta_c$ of approximately 85° or more, or the "−1" order diffraction angle is approximately 85° or more indeed, these two preferred embodiments are associated with each other in that that the device itself, in a reciprocal situation, is identical. Only the directions of incidence and diffraction are reversed. It is thus the orientation of the device relative to an incident wave which determines whether one uses the device with $\theta_c$ or $\epsilon_c$ greater than 80°.

It will also be noted that the analysis by the reciprocity theorem is valid when the diffraction efficiency along a given direction ("−1" order) is high. Theoretically, it is strictly valid only when a single diffracted wave is generated by the diffraction device, with a diffraction efficiency very close or equal to 100%. However, for an efficiency of approximately 95%, the reciprocal situation gives a comparable result for the diffraction efficiency since the neglected waves are of very low intensity. However, for less high diffraction efficiency values, it is not out of the question that the diffraction efficiency values are similar for the two reciprocal situations.

Figure 5:
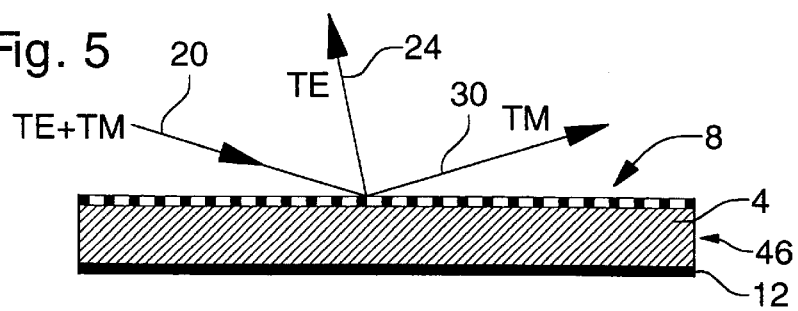

The reflective structure of the diffraction device is formed in a first alternative by a weackly absorbtive metal film (any metal with low losses at the used wavelength in particular from ultraviolet to far infrared) or by a reflecting surface separating layer 4 from a medium, in particular a gaseous medium, having a refractive index which enables a total or almost total reflexion of the determining leaky wave. In another alternative, this structure is formed by a multilayer dielectric structure of very high reflectivity. In yet another alternative, it is formed by a single dielectric layer having a refractive index selected so that at least leaky wave 22 (FIGS. 1 to 3) undergoes total or quasi total reflection. As mentioned in the analytical equation giving height H of dielectric layer 4, in order to generate a resonant mode in layer 4 via an incident wave, this height H depends on the phase shift at the reflection on reflective structure 12. In the case of a perfect metal, this phase shift $\sigma$ is equal to zero for the TM polarisation and equal to $\pi$ for the TE polarisation. Thus, when the excitation condition of said resonant mode is satisfied for a TE polarisation, it will not be satisfied for a TM polarisation. By determining the characteristic parameters of diffraction device 46 (FIG. 5) so as to obtain a high diffraction efficiency for TE polarisation, this device 46 can act as polarisation separator for a non-polarised incident wave. Thus, an incident wave 20 having the two TE and TM polarisations is diffracted with a TE polarisation and reflected with a TM polarisation, the diffracted wave 24 then having a TE polarisation and the reflected wave 30 then having a TM polarisation.

This polarisation function is particularly advantageous in ultraviolet where no satisfactory polarisers exist. This device 46 can act as a polariser, the diffracted wave having a strictly TE or TM polarisation.

The characteristic equation given to satisfy the resonance condition of a leaky mode is also:

$$KHn_f \cos\theta_f = m\pi - \phi/2$$

It appears clearly from this characteristic equation that the resonance condition for a leaky mode in dielectric layer 4 depends upon the refractive index $n_f$ of said layer 4. Then, the resonance condition of a leaky mode also depends upon the wavelength $\lambda$ of the incident wave ($K = 2\pi/\lambda$).

It is clear from these considerations that it is possible, for a determined height H of layer 4, to select the wavelength of the "−1" order diffracted wave by varying the value of refractive index $n_f$ of layer 4. For this purpose, the device according to the invention is associated with means for varying the refractive index $n_f$ of dielectric layer 4 so as to allow a selection of the wavelength of the incident wave which satisfies the excitation condition of a leaky mode. For example, it is possible to vary refractive index $n_f$ by varying the temperature of layer 4. A particularly advantageous embodiment is obtained by an arrangement of electrodes on either side of layer 4, made of an electro-optical material, allowing an electric field to be generated in this layer to cause refractive index $n_f$ to vary as a function of the amplitude of the electric field generated by these electrodes. Thus, the device according to the invention acts as a high resolution wavelength or spectral line selector for the diffracted wave without effecting any movement of the diffraction device relative to the source supplying the incident wave onto this device.

The diffraction device according to the invention can also act as a high resolution wavelength selector in the configuration of a preferred embodiment in which the diffracted wave has a high angle of diffraction $\epsilon_c$ whereas the angle of incidence $\theta_c$ is relatively low. In this situation, the tolerance on angle of incidence $\theta_c$ is low in order to be within the resonance condition. Thus, in this embodiment, it is possible, for a given refractive index $n_f$, to select the wavelength of the diffracted wave by varying the angle of incidence. Since the tolerance on this angle of incidence is relatively small for the excitation of a leaky mode, it is possible to obtain a high resolution wavelength or spectral line selector.

Since $n_f \cos \theta_f = (n_f^2 - n_c^2 \cos^2 \alpha)^{1/2}$, the resonance condition for a leaky mode also depends upon the angle $\alpha = \pi/2 - \theta_c$, i.e. upon the angle of incidence (or in the reciprocal case upon angle of diffraction $\epsilon_c$). The dependence of the aforementioned characteristic equation as a function of $\alpha$ has the consequence that the tolerance is high for $\alpha$ and in particular for a grazing incidence, whereas this tolerance decreases and becomes low when angle $\alpha$ increases and becomes large. As a result of these considerations, when $\alpha$ and $\epsilon_c$ are small, an incident wave having a certain divergence or convergence is diffracted at angle $\epsilon_c$ with a markedly smaller divergence or convergence. This relatively large tolerance property on angle $\alpha$ allows a spectrometer or monochromator grating of great efficiency and little background noise to be achieved for poorly collimated grazing incident waves, which is advantageous in the zones of the spectrum where the available light sources have poor spatial coherence. The reason for the low background noise is that the entire beam to be analysed propagates in direction of reflection 30, except the desired spectral section, which is extracted substantially perpendicularly. Moreover, the device according to the invention can act as a collimator for an incident beam at a small angle of incidence; which corresponds to a preferred embodiment of the invention.

One interesting property with a grazing incidence spectroscopy of the device according to the invention is the large number of grating lines diffracting the incident beam of relatively small width, which translates into a large spectral resolution (angular separation) with a high diffraction efficiency (approximately 100%).

The various aforementioned properties of the diffraction device according to the invention allow numerous interesting applications. Thus, the device according to the invention can also act in particular as a slit scanning spectrometer without a moving part or as an amplitude modulator by causing refractive index $n_f$ of the dielectric layer to vary.

Another interesting property of the device according to the invention is that of improving the spatial coherence of an incident light radiation on the grating when the latter is situated in a laser resonant cavity. When a wide collimated laser beam, incident on the grating at an angle of incidence $\epsilon_c$, is diffracted at a grazing angle, and the energy accumulation is high due to the fact that $\alpha$ is low and that index $n_f$ is high, the leaky mode propagates over a large distance and communicates phase information to the other portions of the diffracted beam at angle $\alpha$. A closing mirror for the laser resonant cavity, placed in the path of the diffracted beam, reflects this phase information to another portion of the incident laser beam in the active medium of the laser by a reciprocal path, which has the effect of increasing the spatial coherence of the laser transmission by phase homogenising the laser beam transverse section.

Figure 6:
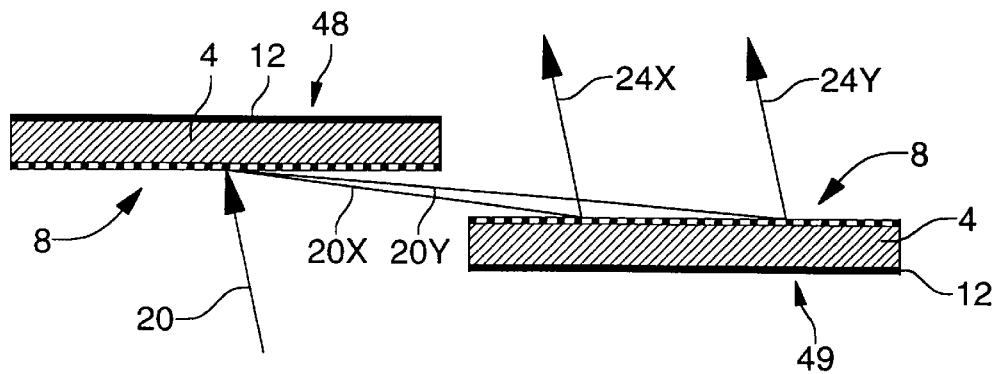

FIG. 6 shows a particular application using two diffraction devices 48 and 49. The system shown in FIG. 6 allows waves having different but close wavelengths to be separated spatially. For a given refractive index $n_f$, it is thus possible to separate spatially the wavelengths contained in an incident beam 20 situated in the narrow spectral band able to excite a working leaky mode. By taking two wavelengths which are close to each other, device 48 diffracts two waves 20X and 20Y corresponding respectively to the two wavelengths under two different, but close directions of diffraction. Using the second device 49, whose diffraction grating is substantially parallel to the grating of device 48, it is possible to separate to a considerable extent diffracted waves 24X and 24Y generated by diffraction on device 49 of incident waves 20X and 20Y. The system of FIG. 6 allows a very high resolution spectral analysis of incident beam 20 to be performed. It is thus possible to separate spatially different wavelengths within the range of tolerance $\delta\lambda$ for the excitation of a leaky mode.

As already mentioned hereinbefore, the device according to the invention, in particular in one of the two preferred embodiments (small $\alpha$ or $\epsilon_f$), generates either a significant expansion of the diameter of the incident beam, or a significant reduction of said diameter, as shown in FIG. 4. Thus device 44 can be used as a beam expander or, in the reciprocal situation, as a beam reducer. In this latter case, the beam reduction is accompanied by a corresponding multiplication of the electric field. This increases in particular the efficiency of the non linear effect in a non linear material, for example an optical frequency doubler crystal, placed in the path of the reduced beam.

One interesting property of a grazing incidence grating is that it allows a relatively narrow beam to be diffracted by a large number of grating lines and thus to obtain a large spectral resolution. The device according to the invention allows a diffraction efficiency close to 100% to be obtained while increasing the spectral resolution by a reduction in angle $\alpha$. This property can be used in a tuneable optical frequency laser resonator mounting called a Litman-Metcalf mounting where a pivoting mirror is placed transversely to diffracted beam 24 by a diffraction grating in the conditions of the present invention. The pivoting axis of the mirror is parallel to the lines of the grating.

In this implementation, the incident medium is air or a vacuum. A high diffraction efficiency over a wide wavelength range is obtained by the use of a low $n_f$ layer, for example $SiO_2$ or $MgF_2$.

A wide wavelength range can also be obtained, with a slight drop in efficiency, by the use of a metal mirror such as gold, silver or aluminium. For example, a diffraction efficiency greater than 80% over a wavelength range of 100 nm centred on the wavelength of 1.55 $\mu$m is obtained with an aluminium mirror, a layer 4 of thickness 200 nm, of refractive index $n_f = 2.13$, an angle $\alpha = 3°$, a grating period of 0.95 $\mu$m and a diffracted angle $\epsilon_c = 39°$. This result can be transposed into any wavelength range. This example is only one of the application possibilities of the device according to the invention in a frequency tuneable laser.

Figure 7:
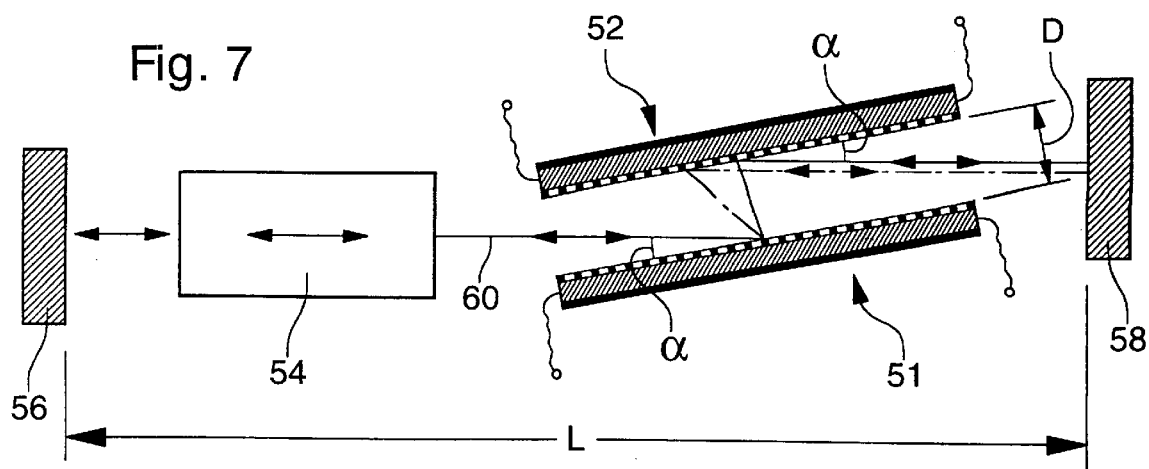
FIG. 7 shows a laser, more particularly the resonant cavity thereof into the heart of which the device according to the invention is introduced to allow selection of the wavelength of the resonant wave without any moving parts.

A particularly interesting application is shown in FIG. 7. Two diffraction devices according to the invention 51 and 52 are arranged in a resonator of a laser including an active medium 54 and two end mirrors 56 and 58. The two devices 51 and 52 are associated with electric means for varying refractive indices $n_f$ of their respective dielectric layers. By using the property defined hereinbefore, it is possible to select with high resolution the wavelength of the wave diffracted by these two devices 51 and 52.

For a given angle of incidence $\alpha$, a variation in refractive index $n_f$ allows a single resonant mode to be selected in the heart of the laser resonant cavity which also fulfils the resonance condition for a leaky mode useful for diffraction. A variation in the wavelength of resonant wave 60 generates a variation in the angle of diffraction on device 51. Since the diffraction grating of device 52 is arranged facing the diffraction grating of device 51, the incident wave on device 52 is situated in a reciprocal situation so that wave 60 is diffracted by this device 52 along a parallel diffraction direction to the direction of incidence of angle 60 arriving on device 51.

For high diffraction efficiency values, it was seen that the reciprocity theorem applies substantially correctly so that a high transmission efficiency of resonant wave 60 is achieved by the assembly formed of the two devices in the two directions of propagation for a wavelength satisfying the excitation condition of a leaky mode in this assembly.

By selecting the distance D between the two diffraction gratings and the length L between the two mirrors 56 and 58, one obtains a frequency tuneable resonator without moving or rotating an element of the resonant cavity, which is very advantageous. One can thus provide multimode lasers with selection of any one of a plurality of longitudinal modes without any moving element and without any longitudinal mode jump when the optical frequency varies.

This property originates from the fact that the geometrical path of resonant wave 60 varies when wavelength λ varies since the angle of diffraction varies as a function of λ as has been shown schematically in FIG. 6. Those skilled in the art can determine the value of α, L and D which lead to an automatically constant number of wavelengths on the optical path in the resonant cavity for the various wavelengths provided. In this application, one will preferably select α to be small and a very high diffraction efficiency, if possible of almost 100%.

Another interesting application of the association of the two identical parallel gratings 51 and 52 such as these shown in FIG. 7 without the laser cavity is that of a very low background noise bandpass wavelength filter where the second grating 52 rejects the scattering created on the first grating 51 by an incident wave 60, the waves scattered on grating 51 having a different direction to that of the diffracted beam or having a different wavelength or a different polarisation to those prescribed for the filter not being diffracted by the second grating in the output direction of the filter which is parallel to the direction of input beam 60.

Finally, it will be noted that all diffraction means equivalent to a diffraction grating can be envisaged, in particular a variation in the refractive index of layer 4. Moreover, the grating or the equivalent diffraction means are not necessarily arranged on the upper face of layer 4, but can also be arranged on the lower face where a reflection is provided given that the incident beam and the diffracted beam are situated on the side of the upper face of layer 4. It will also be noted that the medium $n_c$ can be formed in particular by a solid or a liquid.

What is claimed is:

1. A light wave diffraction device formed of:
   a layer in which light waves can propagate,
   a reflective structure or surface arranged on one lower face of said layer, and
   a diffraction grating or equivalent diffraction means arranged at one face of said layer or within the latter in the form of a periodic modulation of its refractive index; wherein, for an incident wave to be diffracted by this device and having a given wavelength λ and a predetermined angle of incidence on said layer defined relative to the direction perpendicular to this layer, the mean height of said layer substantially satisfies the resonance condition for a leaky mode of the incident wave refracted in this layer, and wherein said grating or equivalent means has/have a spatial period whose value is determined to diffract said incident wave essentially along the first negative order of diffraction and at an angle of diffraction having a value different from a value substantially equal to that of said angle of incidence.

2. A diffraction device according to claim 1, wherein said layer is formed of a dielectric material and has a mean height H selected so that the characteristic equation:

$$KH(n_f^2 - n_c^2 \cos^2 \alpha)^{1/2} = m\pi - \phi/2$$

is substantially satisfied,
where $K = 2\pi/\lambda$,
m is a natural integer number,
$n_c$ is the refractive index of the incidence medium where said incident wave propagates,
$n_f$ is the refractive index of said layer,
$\alpha = \pi/2 - \theta_c$, where $\theta_c$ is said angle of incidence,
φ is the phase shift generated by the reflection of the wave transmitted on said reflective structure or surface of a light wave propagating in said layer as the said leaky mode.

3. A diffraction device according to claim 1, wherein said reflecting structure is formed by a low absorption metal film.

4. A diffraction device according to claim 1, wherein said reflecting structure is formed by a multilayer dielectric mirror of very high reflectivity or by a single dielectric layer or wherein said reflecting surface separates said layer from a fluid medium in particular a gaseous medium having a refractive index selected so that at least one leaky wave propagating according to said leaky mode in said layer undergoes total or almost total reflection.

5. A diffraction device according to claim 1, wherein it forms a high resolution wavelength or spectral line selector for the wave diffracted at said angle of diffraction.

6. A diffraction device according to claim 1, wherein it is associated with means for varying the refractive index of said layer so as to allow selection of the wavelength λ of the incident wave satisfying said resonance condition for a leaky mode.

7. A frequency adjustable or tuneable laser including at the heart of its resonant cavity, delimited by two end mirrors each according to claim 6, the two diffraction gratings of these two devices being situated facing each other and being substantially parallel to each other, said refractive index variation means of said layer of each of these two devices allowing the refractive indices of the two respective layers of these two devices to be jointly varied to select for the resonant wave any one longitudinal mode of a plurality of longitudinal modes of different optical frequencies able to be maintained in said resonant cavity.

8. A laser according to claim 7, wherein the length (L) of said resonant cavity, the distance (D) between the two diffraction gratings, the spatial period (Λ) of these two gratings and the angle of incidence (α) of said resonant wave are selected so that the resonance condition in said cavity is automatically obtained for each of said plurality of longitudinal modes without moving or rotating an element forming said cavity.

9. A Litman-Metcalf tuneable optical frequency laser including in the cavity thereof a diffraction device according to claim 1.

10. A diffraction device accord to claim 1, wherein the depth of said diffraction grating when arranged at one face of said layer or said periodic modulation when said diffraction grating is arranged within said layer is selected so that the amplitude of the wave exiting said layer along direction of reflection is close to or substantially equal to the amplitude of the wave reflected by this layer, both waves having a phase shift corresponding to a destructive interference.

11. A diffraction device according to claim 10, wherein said angle of diffraction, defined relative to the direction perpendicular to said diffraction grating is greater than 80°, said angle of incidence being significantly less than said angle of diffraction and greater than zero.

12. A diffraction device according to claim 11, wherein the depth of said diffraction grating or said periodic modulation of the refractive index of said layer is selected so that the diffraction efficiency of said incident wave in the direction of diffraction corresponding to said angle of diffraction is substantially equal to or greater than 95%.

13. A device according to claim 11, wherein it forms a diameter reducer for an incident beam in the direction of diffraction defined by said angle of diffraction.

14. A device according to claim 10, wherein it forms expander for an incident luminous beam in the direction defined by said angle of diffraction.

15. A device according to claim 14, wherein it forms a collimator for an incident luminous beam when the latter is divergent or a convergent.

16. A device according to claim 10, wherein it forms a polarisation separator for said incident wave, the wave diffracted at said angle of diffraction having respectively a TE or TM polarisation, and the reflected wave having respectively a TM or TE polarisation.

17. A spectrometer including a diffraction device according to claim 10, wherein this device is arranged so that said incident wave has a grazing incidence on its layer, allowing a high spectral resolution with a high diffraction efficiency.

18. A device according to claim 10, wherein said angle of incidence is greater than 80°, said angle of diffraction being significantly less than said angle of incidence.

19. A diffraction device according to claim 18, wherein the incident wave is TE transverse electric and said diffraction grating is arranged at the upper face of said layer, the depth of said diffraction grating being selected so that its value σ substantially satisfies the following equality:

$$\sigma = \frac{4}{K} \cdot \frac{(\sin\alpha \cdot n_c)^{1/2}}{(n_f^2 - n_c^2\cos^2\alpha)^{1/2} \cdot (n_f^2 - n_c^2)^{1/2}} \cdot \left[1 + \left(\frac{n_f\cos\varepsilon_f}{n_c\cos\varepsilon_c}tg(KHn_f\cos\varepsilon_f + \psi/2)\right)^2\right]^{1/2}$$

where $\alpha = \pi/2 - \theta_c$, $K = 2\pi/\lambda$, $n_f$ is the refractive index of said layer, $n_c$ is the refractive index of the incidence medium, H is the mean height of said layer, $\epsilon_c$ is said angle of diffraction, $\epsilon_f = \arcsin(n_c \sin \epsilon_c/n_f)$, Ψ is the phase shift at the reflection on said reflecting structure or surface for the <<−1>> order diffracted wave in said layer.

20. An optical system used to separate spatially in frequency or to spectrally decompose an incident beam formed by at least two waves with different but close optical frequencies, this system including a first diffraction device according to claim 18, and a second diffraction device according to claim 11.

21. A diffraction device according to claim 1, wherein the depth of said diffraction grating or said periodic modulation of the refractive index of said layer is selected so that the diffraction efficiency of said incident wave in a direction of diffraction corresponding to said angle of diffraction is substantially equal to or greater than 95%.

22. A Littman-Metcalf tuneable optical frequency laser including in the cavity thereof a diffraction device according to claim 21.

23. A device according to claim 21, wherein said angle of incidence is greater than 80°, said angle of diffraction being significantly less than said angle of incidence.

* * * * *